(12) United States Patent
Ikemura et al.

(10) Patent No.: US 6,235,446 B1
(45) Date of Patent: May 22, 2001

(54) RADIATION SENSITIVE RESIN COMPOSITION

(75) Inventors: Toshiaki Ikemura; Eiichi Kobayashi; Takayoshi Tanabe; Shin-ichiro Iwanaga, all of Yokkaichi (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 09/134,163

(22) Filed: Aug. 14, 1998

(30) Foreign Application Priority Data

Aug. 15, 1997 (JP) .................................................. 9-233255

(51) Int. Cl.$^7$ .................................................. G03F 7/004

(52) U.S. Cl. .................. 430/270.1; 430/905; 430/910

(58) Field of Search ................................. 430/270.1, 905, 430/910, 170

(56) References Cited

U.S. PATENT DOCUMENTS

| | | | |
|---|---|---|---|
| 5,376,498 | 12/1994 | Kajita et al. ........................ | 430/191 |
| 5,443,690 | * 8/1995 | Takechi et al. ...................... | 430/286 |
| 5,556,734 | 9/1996 | Yamachika et al. ............... | 430/270.1 |
| 5,679,495 | 10/1997 | Yamachika et al. ................ | 430/191 |
| 5,962,184 | * 10/1999 | Allen et al. ........................ | 430/270.1 |

FOREIGN PATENT DOCUMENTS

| | | |
|---|---|---|
| 2-161436 | 6/1990 | (JP) . |
| 2-27660 | 6/1990 | (JP) . |
| 5-249682 | 9/1993 | (JP) . |
| 7-140666 | 4/1995 | (JP) . |

\* cited by examiner

*Primary Examiner*—John S. Chu
(74) *Attorney, Agent, or Firm*—Oblon, Spivak, McClelland, Maier & Neustadt, P.C.

(57) ABSTRACT

A radiation sensitive resin composition comprising (A) a copolymer possessing recurring units of the formulas (1), (2), and (3),

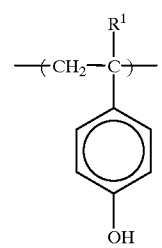
(1)

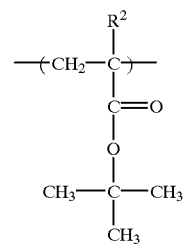

(2)

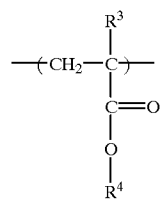

(3)

which turns alkali soluble in the presence of acid and (B) a photosensitive acid generator. Because the composition can resolve line-and-space patterns, isolated patterns, and contact hole patterns with satisfactory appearance and high resolution, it is useful as a chemically amplified positive resist for use in the manufacture of semiconductor devices.

15 Claims, No Drawings

RADIATION SENSITIVE RESIN COMPOSITION

BACKGROUND OF THE INVENTION

1. Field of the Invention

The present invention relates to a radiation sensitive resin composition and, more specifically, a radiation sensitive resin composition useful as a resist suitable for microfabrication using ultraviolet rays, far ultraviolet rays, X-rays, or various radioactive rays such as charged particle rays.

2. Description of the Background Art

In the field of microfabrication, typically in the manufacture of elements for integrated circuits, a rapidly progressing trend is to define design rules for the lithographic process with finer dimensions, with the aim of achieving higher degrees of circuit integration. Accordingly, development of a lithographic process that is capable of microfabrication with precision for a line width of 0.5 µm or less has been vigorously pursued in recent years.

However, drawing such a minute pattern as above with a high enough precision is very difficult with the conventional process based on visible rays (wavelength: 700–400 nm) or near ultraviolet rays (400–300 nm). For this reason, lithographic processes based on radiation with a shorter wavelength (300 nm or less) that is capable of achieving a greater focal depth and establishing finer design rules are being proposed.

As the lithographic processes using such short wavelength radiation, for example, methods based on a KrF excimer laser (wavelength: 248 nm), an ArF excimer laser (wavelength: 193 nm), X-rays such as synchrotron radiation, or charged particle radiation such as electron beams are being proposed. In addition, International Business Machines, Inc. ("IBM") has proposed a "chemically amplified resist" as a high-resolution resist suitable for use with these short wavelength radioactive rays. Improvements in the chemically amplified resist are now being actively pursued.

With a chemically amplified resist, acid is generated when radioactive rays irradiate (a process hereinafter termed "exposure") the photoacid generator contained in such a resist. The acid thus generated acts as a catalyst to trigger chemical reactions such as alteration of polarity, cleavage of chemical bonds, or crosslinking within the exposed part of the resist film. The resulting change in solubility characteristics of the exposed part to a developing solution can then be utilized to develop a pattern.

Among the existing chemically amplified resists, those known for relatively good resist performance include resists based on resins in which (1) an alkali affinitive group in the alkali soluble resin is protected by a t-butyl ester group or t-butoxycarbonyl group (see Japanese Patent Publication No. 27660/1990 or EP 102450 A) ; (2) an alkali affinitive group in the alkali soluble resin is protected by a ketal group (see Japanese Patent Application Laid-Open No. 140666/1995); and (3) an alkali affinitive group in the alkali soluble resin is protected by an acetal group (see Japanese Patent Application Laid-Open No. 161436/1990 and Japanese Patent Application Laid-Open No. 249682/1993).

However, it has been pointed out that each of these chemically amplified resists has a peculiar drawback, giving rise to various obstacles for actual application to microfabrication, particularly with a critical design dimension of 0.25 µm or less.

Specifically, various known chemically amplified resists have to be adopted in each narrowly defined use. Although good resolution with satisfactory appearance is generally available for line-and-space patterns or isolated patterns, resolution is often insufficient for contact holes. Further, popularization of multimedia information processing in recent years has necessitated that designs of semiconductor devices become more diversified. This, coupled with a requirement for a cost reduction to cope with the rapid price decrease in the marketplace, has created a strong demand for the development of a chemically amplified resist which is capable of resolving not only the usual line-and-space patterns but also isolated patterns as well as contact hole patterns with satisfactory appearance and therefore is useful in multiple applications.

The present invention has been made in consideration of the above circumstances and as a result of detailed research and examination applied to the constituents of the chemically amplified resists.

Accordingly, an object of the present invention is to provide a radiation sensitive resin composition suitable as a chemically amplified resist that has efficient response to various radioactive rays. Such a resist is capable of resolving any of line-and-space patterns, isolated patterns, and contact hole patterns with satisfactory appearance and resolution, and therefore is applicable to multiple uses.

SUMMARY OF THE INVENTION

According to the present invention, the above object can be achieved by a radiation sensitive resin composition comprising (A) a copolymer possessing three types of recurring units represented by the formulas (1), (2), and (3),

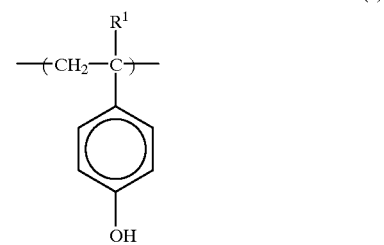

(1)

wherein $R^1$ indicates a hydrogen atom or methyl group,

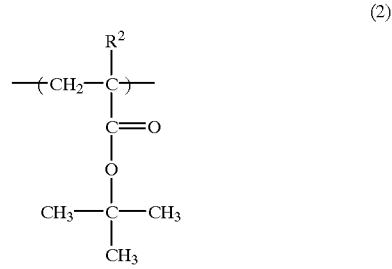

(2)

wherein $R^2$ indicates a hydrogen atom or methyl group, (3)

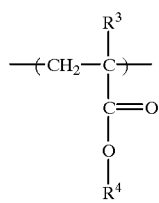

wherein $R^3$ indicates a hydrogen atom or methyl group, and $R^4$, a monovalent group having an alicyclic structure containing 7 or more carbon atoms, the copolymer turning alkali soluble in the presence of acid, and (B) a photosensitive acid generator.

Other objects, features and advantages of the invention will hereinafter become more readily apparent from the following description.

DETAILED DESCRIPTION OF THE INVENTION AND PREFERRED EMBODIMENTS

Copolymer (A)

The Copolymer (A) to be used in the present invention comprises a copolymer possessing three types of recurring units, i.e. a unit of the formula (1) given above (hereinafter referred to as "Recurring unit 1"), a unit of the formula (2) above ("Recurring unit 2"), and a unit of the formula (3) above ("Recurring unit 3"). The copolymer turns alkali soluble in the presence of acid.

The Recurring unit 1 may only comprise either a type wherein $R^1$ is a hydrogen atom or one wherein $R^1$ is a methyl group, or may also comprise a mixture of these unit types.

The percentage content of the Recurring unit 1 in the total recurring unit content in the Copolymer (A) usually is 10 to 75 mol %, preferably 20 to 70 mol %, and even more preferably, 40 to 70 mol %. If the above content is less than 10 mol %, the resist pattern is likely to peel off due to lack of adhesiveness to the substrate. If it is over 75 mol %, on the other hand, it will reduce the differential between the dissolution rates for the alkaline developing solution for the exposed part and unexposed part, thereby causing a declining trend in resolution.

Next, the Recurring unit 2 may only comprise either a type wherein $R^2$ is a hydrogen atom or one wherein $R^2$ is a methyl group, or may also comprise a mixture of these unit types.

The percentage content of the Recurring unit 2 in the total recurring unit content in the Copolymer (A) usually is 10 to 70 mol %, preferably 15 to 60 mol %, and even more preferably, 20 to 50 mol %. If the above content is less than 10 mol %, the dissolution rate of the exposed part to the alkaline developing solution could become too low, making the pattern formation insufficient. If it is over 70 mol %, on the other hand, the quantity of benzene rings in Copolymer (A) becomes insufficient, thereby causing a declining trend in dry etching resistance.

Next, the Recurring unit 3 may only comprise either a type wherein $R^3$ is a hydrogen atom or one wherein $R^3$ is methyl group, or may also comprise a mixture of these unit types.

Further, as $R^4$ in the Recurring unit 3 a monovalent group having an alicyclic structure containing 7 to 15 carbon atoms is preferred. As such a preferred monovalent group with an alicyclic structure, for example, groups represented by the following formulas (4) through (23) can be mentioned:

(4)

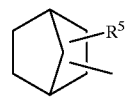

wherein $R^5$ indicates either a hydrogen atom or methyl group, (5)

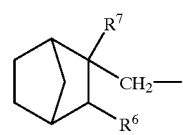

wherein $R^6$ indicates a hydrogen atom or methyl group, and $R^7$, a hydrogen atom or hydroxymethyl group, (6)

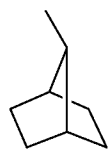

(7)

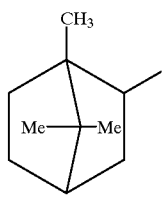

(8)

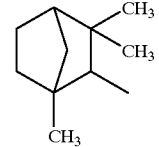

(9)

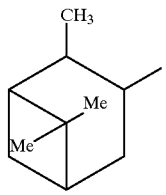

(10)

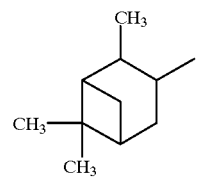

(11) 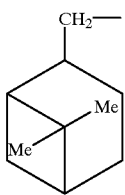

(12) 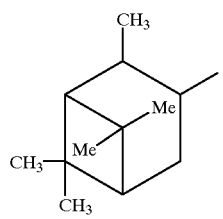

(13) 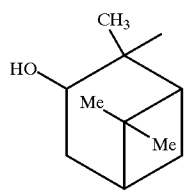

(14) 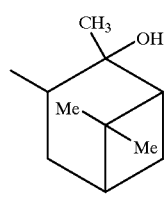

(15) 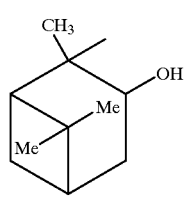

(16) 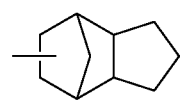

(17) 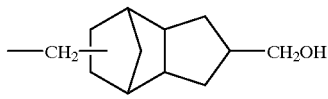

(18) 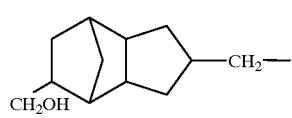

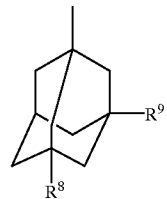
(19)

wherein $R^8$ and $R^9$ indicate a hydrogen atom or methyl group independently of each other,

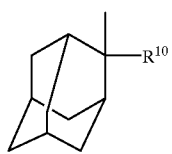
(20)

wherein $R^{10}$ indicates a hydrogen atom or methyl group, (21)

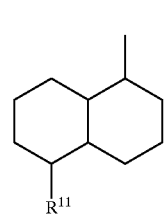

wherein n is either 1 or 2, (22)

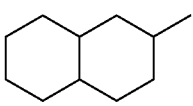

wherein $R^{11}$ indicates a hydrogen atom or methyl group.

(23)

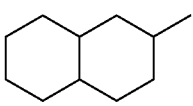

Of these monovalent groups having an alicyclic structure containing 7 or more carbon atoms, a norbornyl group, isobornyl group, tricyclodecanyl group, adamantyl group, adamantylmethyl group, or tricyclo-[5.2.1.0]-decanyl group are preferred.

A monomer that provides the Recurring unit 3 can be prepared, for example, by dripping (meth)acrylic acid chloride into a dichloromethane solution of a monovalent alcohol having an alicyclic structure containing 7 or more carbon atoms, in the presence of a base (e.g. pyridine) and at a temperature below the freezing point, and then allowing the mixture to react for approximately one hour at a room temperature.

The percentage of the Recurring unit 3 in the total recurring unit content in the Copolymer (A) usually is 5 to 50 mol %, preferably 5 to 40 mol %, and even more preferably, 5 to 30 mol %. If the above content is less than 5 mol %, the multipurpose performance covering line-and-space patterns, isolated patterns, and contact hole patterns, which is characteristic of the radiation sensitive resin composition in the present invention, may not be fully realized. If it is over 50 mol %, on the other hand, the quantity of benzene rings in Copolymer (A) becomes inadequate, thereby causing a declining trend in dry etching resistance.

Further, in some cases the Copolymer (A) may also contain other recurring units.

Given as specific examples of monomers providing for such other recurring units are: (α-methyl)styrenes such as styrene, α-methylstyrene, p-methylstyrene, and p-methyl-α-methylstyrene; o-hydroxy(α-methyl) styrenes or their derivatives such as o-hydroxystyrene, o-t-butoxystyrene, o-1-methoxyethoxystyrene, o-1-ethoxyethoxystyrene, o-hydroxy-α-methylstyrene, o-t-butoxy-α-methylstyrene, o-1-methoxyethoxy-α-methylstyrene, and o-1-ethoxyethoxy-α-methylstyrene; m-hydroxy(α-methyl) styrenes or their derivatives such as m-hydroxystyrene, m-t-butoxystyrene, m-1-methoxyethoxystyrene, m-1-ethoxyethoxystyrene, m-hydroxy-α-methylstyrene, m-t-butoxy-α-methylstyrene, m-1-methoxyethoxy-α-methylstyrene, and m-1-ethoxyethoxy-α-methylstyrene; p-hydroxy(α-methyl)styrene derivatives such as p-t-butoxystyrene, p-1-methoxyethoxystyrene, p-1-ethoxyethoxystyrene, p-t-butoxy-α-methylstyrene, p-1-methoxyethoxy-α-methyl styrene, and p-1-ethoxyethoxy-α-methylstyrene; unsaturated carboxylic acids (anhydrides) such as (meth) acrylic acid, crotonic acid, cinnamic acid, maleic acid, maleic acid anhydride, fumaric acid, itaconic acid, itaconic acid anhydride, mesaconic acid, citraconic acid, and citraconic acid anhydride; esters of aforementioned unsaturated carboxylic acids such as methyl ester, ethylester, n-propyl ester, i-propylester, n-butyl ester, i-butyl ester, sec-butyl ester, t-butyl ester (excluding t-butyl (meth) acrylate), n-pentyl ester, n-hexyl ester, 2-hydroxyethyl ester, 2-hydroxypropyl ester, 3-hydroxypropyl ester, 2,2-dimethyl-3-hydroxypropyl ester, cyclohexyl ester, and benzyl ester; unsaturated nitriles such as (meth)acrylonitrile, vinylidene cyanide, crotonitrile, cinnamonitrile, maleinnitrile, fumaronitrile, itaconitrile, mesaconitrile, and citraconitrile; unsaturated amides such as (meth)acrylamide, crotonamide, cinnamamide, maleinamide, fumaramide, itaconamide, mesaconamide, and citraconamide; unsaturated imides such as maleimide and N-phenylmaleimide; unsaturated alcohols such as (meth)allyl alcohol as well as vinylanilines, vinylpyridines, and other vinyl compounds such as N-vinyl-ε-caprolactam, N-vinylpyrrolidone, N-vinylimidazole, and N-vinylcarbazole.

Of these other monomers mentioned above, those capable of providing for a recurring unit represented by the formula (24) given below are preferred:

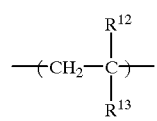

(24)

wherein $R^{12}$ indicates a hydrogen atom or methyl group; $R^{13}$ indicates a hydrogen atom, cyano group, a group represented by the following formula (25):

COOR$^{14}$ (25)

wherein $R^{14}$ is a linear, branched, or cyclic alkyl group of carbon number between 1 to 10, except for a t-butyl group), or a group represented by the following formula:

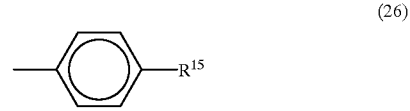

(26)

wherein $R^{15}$ is a hydrogen atom, t-butoxy group, or 1-ethoxyethoxy group).

Monomers that are particularly preferred when supplying other recurring units include styrene, p-t-butoxystyrene, p-1-ethoxyethoxystyrene, methyl (meth)acrylate, ethyl (meth)acrylate, and cyclohexyl (meth)acrylate.

The aforementioned monomers that provide for other recurring units may be used singly or in combinations of two or more.

The percentage of the other recurring unit in the total recurring unit content in the Copolymer (A) is usually up to 40% by weight, but in some cases preferably in a range from 5 to 30% by weight.

The Copolymer (A) can be prepared, for example, by: (a) directly copolymerizing a p-hydroxy(α-methyl)styrene, t-butyl (meth)acrylate, and a (meth)acrylate corresponding to the formula (3);

(b) following direct copolymerization of p-acetoxy(α-methyl)styrene, t-butyl (meth)acrylate, and a (meth)acrylate corresponding to the formula (3), hydrolyzing and/or solvolyzing at least a portion of the acetoxy group in the (α-methyl) styrene unit contained in the copolymer under basic conditions.

The polymerization reaction in the above processes (a) or (b) can be performed by an appropriate method such as block polymerization, solution polymerization, precipitation polymerization, emulsion polymerization, suspension polymerization, or block-suspension polymerization, using a radical polymerization initiator and, optionally, adding a molecular weight modifier.

As the radical polymerization initiator mentioned above, for example, benzoyl peroxide, lauroyl peroxide, 2,2'-azobisisobutyronitrile, 4,4'-azobisisobutyronitrile, 4,4'-azobis(4-cyanovaleric acid), and 2,2'-azobis(4-methoxy-2,4-dimethylvaleronitrile) can be mentioned.

These radical polymerization initiators may be used either singly or in combination of two or more.

Further, examples of the above mentioned molecular weight modifier include, for example, halogenated hydrocarbons such as carbon tetrachloride, chloroform, or carbon tetrabromide; mercaptans such as n-hexylmercaptan, n-octylmercaptan, n-dodecylmercaptan, t-dodecylmercaptan, thioglycollic acid, or thiopropionic acid; xantogenic compounds such as dimethylxantogen disulfide or diisopropylxantogen disulfide, as well as terpinolene and α-methylstyrene dimers.

These molecular weight modifiers may be used either singly or in combinations of two or more.

The polystyrene-reduced weight average molecular weight (hereinafter referred to as "Mw") of the Copolymer (A), as determined by gel permeation chromatography (GPC), is usually between 1,000 and 100,000, preferably between 3,000 and 40,000, and even more preferably, between 3,000 and 30,000. If the Mw of the Copolymer (A) is less than 1,000, the sensitivity, heat resistance, or other characteristics as a resist tend to decline; if higher than 100,000, on the other hand, the solubility in the developing solution tends to be adversely affected.

The ratio of the Mw to the polystyrene-reduced number average molecular weight (hereinafter referred to as "Mn") of the Copolymer (A) as determined by gel permeation chromatography (GPC), i.e. Mw/Mn, is usually 1.0 to 5.0, but preferably 1.0 to 2.0.

In the present invention, either a single type of Copolymer (A) only or a mixture of two or more types may be used.

Furthermore, the Copolymer (A) may be blended with another resin that is compatible with the Copolymer (A) or a low molecular weight compound, as long as the coating uniformity is maintained when the radiation sensitive resin composition in the present invention is applied to a substrate. In this application, it is preferred that the other resin and the low molecular weight compound be incorporated in an amount not more than 50 parts by weight for 100 parts by weight of the Copolymer (A).

Photoacid generator (B)

The photoacid generator (B) to be used in the present invention (hereinafter referred to as "Acid generator (B)") comprises a compound that generates an acid upon exposure to irradiation.

As the acid generator (B), for example, ① onium salt compounds, ② sulfone compounds, ③ sulfonic acid ester compounds, ④ sulfonimide compounds, and ⑤ diazomethane compounds as described below can be mentioned:

① Onium salt compounds

As onium salt compounds, for example, iodonium salts, sulfonium salts, phosphonium salts, diazonium salts, ammonium salts, or pyridinium salts can be mentioned.

Specific examples of onium salt compounds include bis(4-t-butylphenyl)iodonium trifluoromethanesulfonate, bis(4-t-butylphenyl)iodonium nonafluorobutanesulfonate, bis(4-t-butylphenyl)iodonium pyrenesulfonate, bis(4-t-butylphenyl)iodonium dodecylbenzenesulfonate, bis(4-t-butylphenyl)iodonium p-toluenesulfonate, bis(4-t-butylphenyl)iodonium benzenesulfonate, bis(4-t-butylphenyl)iodonium 10-camphorsulfonate, bis (4-t-butylphenyl)iodonium octanesulfonate, diphenyliodonium trifluoromethanesulfonate, diphenyliodonium nonafluorobutanesulfonate, diphenyliodonium pyrenesulfonate, diphenyliodonium dodecylbenzenesulfonate, diphenyliodonium p-toluenesulfonate, diphenyliodonium benzenesulfonate, diphenyliodonium 10-camphorsulfonate, diphenyliodonium octanesulfonate, triphenylsulfonium trifluoromethanesulfonate, triphenylsulfonium nonafluorobutanesulfonate, triphenylsulfonium naphthalenesulfonate, triphenylsulfonium 10-camphorsulfonate, triphenylsulfonium octanesulfonate, triphenylsulfonium hexafluoroantimonate, 4-t-butoxyphenyldiphenylsufonium nonafluorobutansulfonate, 4-t-butoxyphenyldiphenylsufonium no-camphorsulfonate, 4-hydroxyphenylbenzylmethylsulfonium p-toluenesulfonate, and the like.

② Sulfone compounds

As sulfone compounds, for example, β-ketosulfones, β-sulfonylsufones and their α-diazo compounds can be mentioned.

Specific examples of sulfone compounds include phenacylphenylsulfone, mesitylphenacylsulfone, bis(phenylsulfonyl)methane, 4-trisphenacylsulfone, and the like.

③ Sulfonic acid esters

As sulfonic acid esters, for example, alkyl sulfonates, haloalkyl sulfonates, aryl sulfonates, and imino sulfonates can be mentioned.

Specific examples of sulfonic acid esters include benzointosylate, pyrogalloltristrifluoromethane sulfonate, pyrogallolmethanesulfonic acid triester, nitrobenzyl-9,10-diethoxyanthracene-2-sulfonate, α-methylolbenzointosylate, α-methylolbenzoinoctane sulfonate, α-methylolbenzointrifluoromethane sulfonate, α-methylolbenzoindodecyl sulfonate, and the like.

④ Sulfonimide compounds

As sulfonimide compounds, for example, those which are expressed by the formula (27) given below can be mentioned:

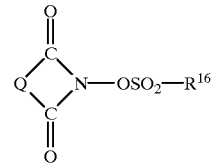

(27)

wherein Q represents a divalent group such as an alkylene group, arylene group, or alcoxylene group, and $R^{16}$ represents a monovalent group such as an alkyl group, aryl group, halogenated alkyl group, or halogenated aryl group.

Specific examples of sulfonimide compounds include N-(trifluoromethylsulfonyloxy)succinimide, N-(trifluoromethylsulfonyloxy)phthalimide, N-(trifluoromethylsulfonyloxy)diphenylmaleimide, N-(trifluoromethylsulfonyloxy)-bicyclo-[2.2.1]-hepto-5-ene-2,3-dicarboxyimide, N-( trifluoromethylsulfonyloxy)-7-oxabicyclo-[2.2.1]-hepto-5-ene-2,3-dicarboxyimide, N-(trifluoromethylsulfonyloxy)-bicyclo-[2.2.1]-heptane-5,6-oxy-2,3-dicarboxyimide, N-(trifluoromethylsulfonyloxy) naphthylimide, N-(camphorsulfonyloxy)succinimide, N-(camphorsulfonyloxy)phthalimide, N-(camphorsulfonyloxy)diphenylmaleimide, N-(camphorsulfonyloxy)-bicyclo-[2.2.1]-hepto-5-ene-2,3-dicarboxyimide, N-(camphorsulfonyloxy)-7-oxabicyclo-[2.2.1]-hepto-5-ene-2,3-dicarboxyimide, N-(camphorsulfonyloxy)-bicyclo-[2.2.1]-heptane-5,6-oxy-2,3-dicarboxyimide, N-(camphorsulfonyloxy) naphthylimide, N-(4-methylphenylsulfonyloxy)succinimide, N-(4-methylphenylsulfonyloxy)phthalimide, N-(4-methylphenylsulfonyloxy)diphenylmaleimide, N-(4-methylphenylsulfonyloxy)-bicyclo-[2.2.1]-hepto-5-ene-2,3-dicarboxyimide, N-(4-methylphenylsulfonyloxy)-7-oxabicyclo-[2.2.1]-hepto-5-ene-2,3-dicarboxyimide, N-(4-methylphenylsulfonyloxy)-bicyclo-[2.2.1]-heptane-5,6-oxy-2,3-dicarboxyimide, N-(4-methylphenylsulfonyloxy) naphthylimide, N-(2-trifluoromethylphenylsulfonyloxy)succinimide, N-(2-trifluoromethylphenylsulfonyloxy)phthalimide, N-(2-trifluoromethylphenylsulfonyloxy)

diphenylmaleimide, N-(2-trifluoromethylphenylsulfonyloxy)-bicyclo-[2.2.1]-hepto-5-ene-2,3-dicarboxyimide, N-(2-trifluoromethylphenylsulfonyloxy)-7-oxabicyclo-[2.2.1]-hepto-5-ene-2,3-dicarboxyimide, N-(2-trifluoromethylphenylsulfonyloxy)-bicyclo-[2.2.1]-heptane-5,6-oxy-2,3-dicarboxyimide, N-(2-trifluoromethylphenylsulfonyloxy)naphthylimide, N-(4-fluorophenylsulfonyloxy)succinimide, N-(4-fluorophenylsulfonyloxy)phthalimide, N-(4-fluorophenylsulfonyloxy)diphenylmaleimide, N-(4-fluorophenylsulfonyloxy)bicyclo-[2.2.1]-hepto-5-ene-2,3-dicarboxyimide, N-(4-fluorophenylsulfonyloxy)-7-oxabicyclo-[2.2.1]-hepto-5-ene-2,3-dicarboxyimide, N-(4-fluorophenylsulfonyloxy)-bicyclo-[2.2.1]-heptane-5,6-oxy-2,3-dicarboxyimide, N-(4-fluorophenylsulfonyloxy)naphthylimide, and the like.

⑤ Diazomethane compounds

As diazomethane compounds, for example, those which are expressed by the formula (28) given below can be mentioned:

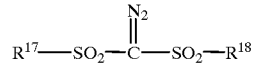

(28)

wherein each of $R^{17}$ and $R^{18}$ represents, independently of each other, a monovalent group such as alkyl group, cycloalkyl group, aryl group, halogenated alkyl group, or halogenated aryl group.

Specific examples of diazomethane compounds include bis(trifluoromethylsulfonyl)diazomethane, bis(cyclohexylsulfonyl)diazomethane, bis(phenylsulfonyl)diazomethane, bis(p-toluenesulfonyl)diazomethane, methylsulfonyl-p-toluenesulfonyldiazomethane, 1-cyclohexylsulfonyl-1-(1,1-dimethylethylsulfonyl)diazomethane, bis(1,1-dimethylethylsulfonyl)diazomethane, and the like.

Of the acid generators (B) mentioned above, compounds that generate trifluoromethanesulfonic acid, nonafluorobutanesulfonic acid, or 10-camphorsulfonic acid are preferred.

Specific examples of such preferred compounds as the Acid generator (B) include bis(4-t-butylphenyl)iodonium trifluoromethanesulfonate, bis(4-t-butylphenyl)iodonium nonafluorobutanesulfonate, bis(4-t-butylphenyl)iodonium p-toluenesulfonate, bis( 4-t-butylphenyl)iodonium 10-camphorsulfonate, diphenyliodonium trifluoromethanesulfonate, diphenyliodonium nonafluorobutanesulfonate, diphenyliodonium p-toluenesulfonate, diphenyliodonium 10-camphorsulfonate, triphenylsulfonium trifluoromethanesulfonate, triphenylsulfonium nonafluorobutanesulfonate, triphenylsulfonium 10-camphorsulfonate, 4-t-butoxyphenyldiphenylsufonium nonafluorobutanesulfonate, 4-hydroxyphenyl-benzylmethylsulfonium p-toluenesulfonate, N-(trifluoromethylsulfonyloxy)succinimide, N-(trifluoromethylsulfonyloxy)phthalimide, N-(trifluoromethylsulfonyloxy)diphenylmaleimide, N-(trifluoromethylsulfonyloxy)bicyclo-[2.2.1]-hepto-5-ene-2,3-dicarboxyimide, N-(trifluoromethylsulfonyloxy)-7-oxabicyclo-[2.2.1]-hepto-5-ene-2,3-dicarboxyimide, N-(trifluoromethylsulfonyloxy)-bicyclo-[2.2.1]-heptane-5,6-oxy-2,3-dicarboxyimide, N-(trifluoromethylsulfonyloxy)naphthylimide, N-(camphorsulfonyloxy)succinimide, N-(camphorsulfonyloxy)phthalimide, N-(camphorsulfonyloxy)diphenylmaleimide, N-(camphorsulfonyloxy)-bicyclo-[2.2.1]-hepto-5-ene-2,3-dicarboxyimide, N-(camphorsulfonyloxy)-7-oxabicyclo-[2.2.1]-hepto-5-ene-2,3-dicarboxyimide, N-(camphorsulfonyloxy)-bicyclo-[2.2.1]-heptane-5,6-oxy-2,3-dicarboxyimide, N-(camphorsulfonyloxy) naphthylimide, and the like.

In the present invention, a single type of acid generator (B) only or a mixture of two or more types may be used.

The quantity of acid generator (B) to be used is usually 0.5 to 20 parts by weight, and preferably 1 to 10 parts by weight for 100 parts by weight of the Copolymer (A). If the quantity of the acid generator (B) used is less than 0.5 parts by weight, the catalytic effects of acid generated by an exposure may be insufficient to cause the desired amount of chemical reaction; if the quantity is more than 20 parts by weight, coating with the composition may become uneven or development residue (called "scum") may result at the time of development.

Acid diffusion controller

In the present invention, it is preferable to use an acid diffusion controller to restrain the acid that is generated from the exposed Acid generator (B) from diffusing inside the resist film, thereby hindering undesirable chemical reactions occurring in the unexposed area of the resist. Use of such an acid diffusion controller improves the storage stability of the composition as well as resolution of a resist. Moreover, the acid diffusion controller minimizes fluctuations in the line width on a resist pattern that result from varying transition time between an exposure process and a post-exposure baking process, making the overall process reliability exceedingly superior.

As an acid diffusion controller mentioned above, nitrogen-containing organic compounds are preferred because such compounds do not change basicity with exposure or heating treatment received during the resist pattern formation process. Specific examples of such compounds include those which are expressed by the formula (29) given below (hereinafter referred to as nitrogen-containing compound (I)):

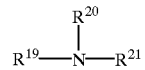

(29)

wherein each of $R^{19}$, $R^{20}$, and $R^{21}$ represents, independently of each other, a hydrogen atom, alkyl group, cycloalkyl group, aryl group, or aralkyl group, as well as diamino compounds that possess two nitrogen atoms in a molecule (hereinafter referred to as nitrogen-containing compound (II)), polymers that possess three or more nitrogen atoms in a molecule (hereinafter referred to as nitrogen-containing compound (III)), amide group-containing compounds, urea compounds, and nitrogen-containing heterocyclic compounds.

Given as specific examples of such a nitrogen-containing compound (I) are: monoalkyl amines such as n-hexylamine, n-heptylamine, n-octylamine, n-nonylamine, and n-decylamine; dialkyl amines such as di-n-butylamine, di-n-pentylamine, di-n-hexylamine, di-n-heptylamine, di-n-octylamine, di-n-nonylamine, and di-n-decylamine; trialkyl amines such as triethylamine, tri-n-propylamine, tri-n-butylamine, tri-n-pentylamine, tri-n-hexylamine, tri-n-heptylamine, tri-n-octylamine, tri-n-nonylamine, tri-n-decylamine, tricyclohexylamine, and dicyclohexyl methylamine; and aromatic amines such as aniline, N-methylaniline, N,N-dimethylaniline, 2-methylaniline, 3-methylaniline, 4-methylaniline, 4-nitroaniline, diphenylamine, triphenylamine, and naphthylamine.

Given as specific examples of such a nitrogen-containing compound (II) are ethylenediamine, N,N,N',N'-tetramethylethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, 2,2'-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis[1-(4-aminophenyl)-1-methylethyl]benzene, 1,3-bis [1-(4-aminophenyl)-1-methylethyl]benzene, and the like.

Specific examples of the nitrogen-containing compound (III) include polyethyleneimine, polyallylamine, and a polymer of dimethylaminoethylacrylamide.

As the aforementioned amide group-containing compounds, for example, formamide, N-methylformamide, N,N'-dimethylformamide, acetoamide, N-methylacetoamide, N,N'-dimethylacetoamide, propionamide, benzamide, pyrrolidone, and N-methylpyrrolidone can be mentioned.

As the aforementioned urea compounds, for example, urea, methylurea, 1,1-dimethylurea, 1,3-dimethylurea, 1,1,3,3-tetramethylurea, 1,3-diphenylurea, and tri-n-butylthiourea can be mentioned.

As the aforementioned nitrogen-containing heterocyclic compounds, for example, imidazoles such as imidazole, benzimidazole, 4-methylimidazole, and 4-methyl-2-phenylimidazole; pyridines such as pyridine, 2-methylpyridine, 4-methylpyridine, 2-ethylpyridine, 4-ethylpyridine, 2-phenylpyridine, 4-phenylpyridine, N-methyl-4-phenylpyridine, nicotine, nicotinic acid, nicotinic acid amide, chinoline, 8-oxychinoline, and acridine, as well as pyrazine, pyrazole, pyridazine, quinoxaline, purine, pyrrolidine, piperidine, morpholine, 4-methylmorpholine, piperazine, 1,4-dimethylpiperazine, and 1,4-diazabicyclo-[2.2.2]-octane can be mentioned.

Among these nitrogen-containing organic compounds mentioned, the nitrogen-containing compound (I) and nitrogen-containing heterocyclic compounds are preferred. Within the group of nitrogen-containing compound (I), trialkyl amines are particularly preferred and, within nitrogen-containing heterocyclic compounds, pyridines are particularly preferred.

In the present invention, a single type of acid diffusion controller only or a mixture of two or more types may be used.

The quantity of acid diffusion suppressant to be used in proportion to 100 parts by weight of Copolymer (A) is usually 15 parts by weight or less, preferably 0.001 to 10 parts by weight, and even more preferably 0.005 to 5 parts by weight. If the quantity of the acid diffusion controller used exceeds 15 parts by weight, sensitivity as a resist or the developing properties of its exposed parts tend to decline. If the quantity is less than 0.001 part by weight, pattern geometry or dimensional accuracy as a resist could be harmed depending on the processing condition.

Other additives

The radiation sensitive resin composition in the present invention may be formulated with various other additives such as surfactants and photosensitizers.

The surfactants function to improve coating and striation characteristics of the composition, or the developing properties as a resist.

As such a surfactant, for example, polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, and polyethylene glycol distearate can be mentioned. Commercially available surfactants, for example, include F-Top EF301, EF303, and EF352 (manufactured by Tochem Products Co., Ltd.), Megafax F171 and F173 (manufactured by Dainippon Ink & Chemicals, Inc.), Florado FC430 and FC431 (manufactured by Sumitomo 3M Ltd.), Asahiguard AG710, Surflon S-382, SC101, SC102, SC103, SC104, SC105, and SC106 (manufactured by Asahi Glass Co., Ltd.), KP341 (manufactured by Shin-Etsu Chemical Co., Ltd.), and Polyflo No. 75 and No. 95 (manufactured by Kyoeisha Chemical Co., Ltd.).

The dosage of surfactants is usually up to 2 parts by weight for 100 parts by weight of the Copolymer (A).

The aforementioned photosensitizer functions to absorb the radiation energy and then transmit such energy to the acid generator (B), thereby increasing the amount of acid generated by exposure, which in turn improves the apparent sensitivity of a resist.

Examples of preferred photosensitizers include benzophenones, Rose Bengales, and anthracenes.

The dosage of photosensitizersis usually up to 50 parts by weight for 100 parts by weight of the Copolymer (A).

Additionally, formulating dyes or pigments enables making latent images visible in the exposed area so that the influence of halation at time of exposure is minimized. Use of an adhesive aid helps further improve adhesion with substrates.

Other additives including halation preventives such as 4-hydroxy-4'-methylchalcone, shape modifiers, storage stability improvers, or anti-foam agents may be included as well.

Solvents

The radiation sensitive resin composition in the present invention, at the time of application, is prepared as a compositional solution by homogeneously dissolving the composition into a solvent so that the total solid in the preparation is 5 to 50% by weight, or more preferably 10 to 40% by weight, and then passing it through a filter having, for example, a pore diameter of 0.2 $\mu$m.

Solvents for use in the preparation of such a compositional solution, for example, include: ethylene glycol monoalkyl ether acetates such as ethylene glycol monomethyl ether acetate, ethylene glycol monoethyl ether acetate, ethylene glycol mono-n-propyl ether acetate, and ethylene glycol mono-n-butyl ether acetate; propylene glycol monoalkyl ethers such as propylene glycol monomethyl ether, propylene glycol monoethyl ether, propylene glycol mono-n-propyl ether, and propylene glycol mono-n-butyl ether; propylene glycol dialkyl ethers such as propylene glycol dimethyl ether, propylene glycol diethyl ether, propylene glycol di-n-propyl ether, and propylene glycol di-n-butyl ether; propylene glycol monoalkyl ether acetates such as propylene glycol monomethyl ether acetate, propylene glycol monoethyl ether acetate, propylene glycol mono-n-propyl ether acetate, and propylene glycol mono-n-butyl ether acetate; lactic acid esters such as methyl lactate, ethyl lactate, n-propyl lactate, and i-propyl lactate; aliphatic carboxylic acid esters such as n-amyl formate, i-amyl formate, ethyl acetate, n-propyl acetate, i-propyl acetate, n-butyl acetate, i-butyl acetate, n-pentyl acetate, i-pentyl acetate, i-propyl propionate, n-butyl propionate, and i-butyl propionate; other esters such as ethyl hydoxyacetate, ethyl 2-hydroxy-2-methylpropionate, methyl 2-hydroxy-3-methylbutyrate, ethyl methoxyacetate, ethyl ethoxyacetate, methyl 3-methoxypropionate, ethyl 3-methoxypropionate, methyl 3-ethoxypropionate, ethyl 3-ethoxypropionate, 3-methoxybutyl acetate, 3-methyl-3-methoxybutyl acetate, 3-methyl-3-methoxybutyl propionate, 3-methyl-3-methoxybutyl butyrate, methyl acetoacetate, ethyl acetoacetate, methyl piruvate, and ethyl piruvate; aromatic hydrocarbons such as toluene and xylene; ketones such as methyl ethyl ketone, methyl propyl ketone, methyl butyl ketone, 2-heptanone, 3-heptanone, 4-heptanone, and cyclohexanone; amides such as N-methylformamide, N,N-dimethylformamide, N-methylacetoamide, N,N-dimethylacetoamide, and N-methylpyrrolidone; and lactones such as γ-butylolactone.

These solvents may be used either singly or in combinations of two or more.

Resist pattern formation

To form a resist pattern using the radiation sensitive resin composition of the present invention, the composition solution prepared as described in the above is applied to a substrate, for example, of a silicon wafer or an aluminum coated wafer, with an appropriate method such as spin coating, cast coating, or roll coating to form a resist film. The resist film is heat-treated in advance (hereinafter called "pre-bake") at a temperature of 70 to 160° C., if necessary, and then exposed through a desired mask pattern. Radiation to be used for the exposure is chosen, for example, from ultraviolet rays such as i-line (with a wavelength of 365 nm), far ultraviolet rays such as an ArF excimer laser (193 nm) or KrF excimer laser (248 nm), X-rays such as synchrotron radiation or charged particle rays such as an electron beam, in accordance with the type of acid generator (B) used. Process conditions such as the amount of exposure are also selected as appropriate based on the formulation of the radiation sensitive resin composition and types of additives used.

In the present invention, it is preferred to perform a heat-treatment after the exposure (hereafter called "post-bake") to improve the apparent sensitivity of the resist film. Although the temperature for the heat treatment varies depending on the formulation of the radiation sensitive resin composition and types of additives used, it is usually 30 to 200° C., and preferably 50 to 150° C.

The exposed resist film is then developed using an alkaline developing solution, usually at 10 to 50° C. and for 30 to 200 seconds, to obtain the desired resist pattern.

For such an alkaline developing solution mentioned above, for example, an aqueous alkaline solution is prepared and used with at least one type of alkaline compound such as alkali metal hydroxides, aqueous ammonia, mono-, di- or tri-alkyl amines, mono-, di- or tri-alkanol amines, heterocyclic amines, tetraalkylammonium hydroxides, choline, 1,8-diazabicyclo-[5.4.0]-7-undecene, or 1,5-diazabicyclo-[4.3.0]-5-nonene, so that the solution usually contains 1 to 10% by weight or preferably 1 to 5% by weight of these substances.

The aforementioned developing solution comprising an aqueous alkaline solution may also be supplemented with an appropriate amount of water-soluble organic solvent such as methanol and ethanol, or surfactants.

As a general practice when a developing solution comprising an aqueous alkaline solution is used, the resulting resist pattern is washed with water after the development.

On preparing resist patterns, a protective film may be provided on a resist film to prevent influence from basic impurities existing in the surrounding environment.

In the following descriptions, a more detailed explanation of this invention will be presented based on examples. However, the present invention is not in any way whatsoever restricted to those described in the examples.

In the examples and comparative examples presented hereafter, measurement of the Mw and Mn as well as evaluation of each resist are performed under the conditions given below:

Mw and Mn

Both the Mw and Mn were measured by gel permeation chromatography (GPC) based on the monodisperse polystyrene as a standard, using columns (two of the model G2000H$_{XL}$, and one each of G3000H$_{XL}$ and G4000H$_{XL}$) made by Tosoh Corp., under the analytical conditions of a flow rate at 1.0 ml/min., using tetrahydrofurane as the elucent, and at a column temperature of 40° C.

Resolution (1L1S)

The resolution (1L1S) for a line-and-space-pattern (1L1S) is defined as the smallest dimension (in μm) of the resist pattern that can be resolved at an optimum exposure, which is the amount of radiation energy that can project a line-and-space-pattern (1L1S) into a 1 to 1 width ratio at the design line width of 0.26 μm.

Resolution (1L3S)

The resolution (1L3S) for a semi isolated pattern (1L3S) is defined as the smallest dimension (in μm) of the line pattern that can be resolved at an optimum exposure, which is the amount of radiation energy that can project a semi isolated pattern (1L3S) into a 1 to 3 width ratio at the design line width of 0.26 μm.

Resolution (CH)

The resolution (CH) is defined as the smallest dimension (in μm) of the lower end diameter of a contact hole that can be resolved at an optimum exposure, which is the amount of radiation energy that can project a contact hole whose cross section is a round shape when a resist pattern is projected using a reticle with a designed grid pattern of 0.26 μm by 0.26 μm.

Pattern shape (1L1S)

On a line-and-space-pattern (1L1S) with the design line width of 0.26 μm, and for the line widths at the upper end, the middle, and the lower end of the line pattern that are termed La, Lb, and Lc, respectively; if the criteria:

$$0.9 \times Lb < La < 1.1 \times Lb$$

and $$1.0 \times Lb < Lc < 1.3 \times Lb$$

are both satisfied concurrently, the pattern shape (1L1S) of the line-and-space-pattern(1L1S) is determined as "satisfactory"; otherwise the pattern shape (1L1S) is judged "unsatisfactory".

Pattern shape (1L3S)

On a semi isolated pattern (1L3S) with the design line pattern width of 0.26 μm, and for the line widths at the upper end, the middle, and the lower end of the line pattern that are termed La, Lb, and Lc, respectively; if the criteria:

$$0.9 \times Lb < La < 1.1 \times Lb$$

and $$1.0 \times Lb < Lc < 1.3 \times Lb$$

are both satisfied concurrently, the pattern shape (1L3S) of the semi isolated pattern (1L3S) is determined as "satisfactory"; otherwise the pattern shape (1L3S) is judged "unsatisfactory".

Pattern shape (CH)

When a resist pattern is projected using a reticle with a designed grid pattern of 0.26 μm by 0.26 μm, and for the diameters at the upper end (i.e. "Dt") and the lower end ("Db") of a contact hole whose cross section is projected as a round shape; if the criteria:

$$0.7 < Dt/Db < 1.4$$

is satisfied, the pattern shape (CH) of the contact hole is determined as "satisfactory"; otherwise the pattern shape (CH) is judged "unsatisfactory".

Other features of the invention will become apparent in the course of the following description of the exemplary embodiments which are given for illustration of the invention and are not intended to be limiting thereof.

EXAMPLES

Synthesis of Copolymer (A)

Synthesis Example 1

The raw materials, i.e. 108 g (0.67 mol) of p-acetoxystyrene, 32 g (0.25 mol) of t-butyl acrylate, 17 g (0.08 mol) of isobornyl acrylate which has the group represented by the formula (7) described previously, and 6.6 g of 2,2'-azobisisobutylonitrile were dissolved in 157 g of propylene glycol monomethyl ether, and polymerized at 70° C. for 8 hours in a nitrogen atmosphere. After completion of the polymerization, the reaction solution was dripped into a large quantity of hexane to purify the resultant resin by coagulation. Onto the purified resin, 157 g of propylene glycol monomethyl ether was again added, followed by the additions of 157 g of methanol, 74 g of trimethylamine, and 13 g of water to hydrolyze for 8 hours under a boiling reflux. After the reaction, the solvents and trimethylamine were removed by vacuum distillation, and the resin so obtained was dissolved in acetone and then dripped into a large quantity of water. The resultant white powder was separated by filtration and left overnight under vacuum at 50° C. to dry.

The final product had an Mw of 15,000 and an Mw/Mn ratio of 1.85; the copolymerization molar ratio between p-hydroxystyrene, t-butyl acrylate, and isobornyl acrylate as determined by a $^{13}$C-NMR analysis was 67:24:9. This resin is henceforth referred to as Copolymer (A-1).

Synthesis Example 2

The raw materials, i.e. 86 g (0.72 mol) of p-hydroxystyrene, 20 g (0.15 mol) of t-butyl acrylate, and 26 g (0.13 mol) of tricyclodecanyl acrylate which has the group represented by the formula (16) described previously, were dissolved in 120 g of dioxane, and nitrogen gas was bubbled into the solution for 30 minutes. After adding 6.5 g of 2,2'-azobisisobutylonitrile to the solution, polymerization reaction was carried out at 70° C. for 10 hours in a nitrogen atmosphere. After completion of the polymerization, the reaction solution was dripped into a large quantity of water, and the resultant white powder was separated by filtration and left overnight under vacuum at 50° C. to dry.

The final product had an Mw of 13,000 and an Mw/Mn ratio of 1.8; the copolymerization molar ratio between p-hydroxystyrene, t-butyl acrylate, and tricyclodecanyl acrylate as determined by a $^{13}$C-NMR analysis was 72:16:14. This resin is henceforth referred to as Copolymer (A-2).

Synthesis Example 3

Except for the monomers used, i.e. 114 g (0.71 mol) of hydroxy styrene, 19 g (0.15 mol) of t-butyl acrylate, 15 g (0.07 mol) of isobornyl acrylate, and 8 g (0.07 mol) of styrene, a resin was synthesized in the same manner as in the Synthesis Example 2.

The final product had an Mw of 14,000 and a Mw/Mn ratio of 1.6; the copolymerization molar ratio between p-hydroxystyrene, t-butyl acrylate, isoborbyl acrylate, and styrene as determined by a $^{13}$C-NMR analysis was 72:14:7:7. This resin is henceforth referred to as Copolymer (A-3).

Comparative Synthesis Example 1

The raw materials, i.e. 72 g of p-hydroxy styrene and 57 g of t-butyl acrylate, were dissolved in 150 g of dioxane, and nitrogen gas was bubbled into the solution for 30 minutes. After adding 1.9 g of 2,2'-azobis(4-methoxy-2,4-dimethyl valeronitrile) to the solution, the mixture was polymerized at 60° C. for 7 hours in a nitrogen atmosphere. After the completion of the polymerization, the reaction solution was dripped into a large quantity of hexane to coagulate the resin. The resin was then purified by several repetitions of dissolving in dioxane followed by coagulation in hexane to remove the residual monomer, and the resultant product was separated by filtration and left overnight under vacuum at 50° C. to dry.

The final product had an Mw of 27,000 and an Mw/Mn ratio of 1.8; the copolymerization molar ratio between p-hydroxystyrene and t-butyl acrylate, as determined by a $^1$H-NMR analysis was 61:39. This resin is henceforth referred to as Copolymer (a-1).

Comparative Synthesis Example 2

Into a solution of 12 g of poly(p-hydroxystyrene) and 5 g of triethylamine dissolved in 50 g of dioxane, 7.0 g of di-t-butylcarbonate was added while stirring. After 6 hours of stirring, oxalic acid was added to neutralize the triethylamine. Subsequently, the reacted solution was dripped into a large quantity of water to coagulate the resin. The product was then purified by washing with several cycles of purified water, and the resultant white resin was separated by filtration and left overnight under vacuum at 50° C. to dry.

The final product had an Mw of 9,200 and an Mw/Mn ratio of 2.8. The $^{13}$C-NMR analysis showed that the product had a structure in which 30% of the hydrogen atoms belonging to the phenolic hydroxyl group in poly(p-hydroxystyrene) was substituted with a t-butoxycarbonyl group. This resin is henceforth referred to as Copolymer (a-2).

Examples 1–10 and Comparative Examples 1–3

Composition solutions were prepared by uniformly dissolving the constituents as listed in Table 1 (proportions expressed in parts by weight) and filtering through a membrane filter having a pore diameter of 0.2 μm.

Each composition solution was spin-coated on a silicon wafer and pre-baked under the conditions indicated in Table 2 to form a resist film having a thickness of 0.7 μm.

In the Examples 1 through 9 and Comparative Examples 1 through 3, exposure with a KrF excimer laser (wavelength:

248 nm) was provided using a stepping projection aligner Model SR²⁰⁰⁵EX08A (manufactured by Nikon Corp.) For the Example 10, exposure to an electron beam was provided using a direct writing electron beam lithography system (acceleration voltage: 50 KeV, manufactured by Hitachi, Ltd). After a post-bake given according to the conditions in Table 2, alkali development was performed in a tetramethylammonium hydroxide solution (2.38%) using a paddle development method at 23° C. for 45 seconds, followed by washing with purified water and drying to obtain positive resist patterns in the end.

Table 3 summarizes the evaluation results for each resist.

Descriptions of constituents listed in Table 1, with exception of copolymers, are given below:

Acid generators
 B-1: bis(4-t-butylphenyl)iodonium nonafluorobutanesulfonate
 B-2: bis(4-t-butylphenyl)iodonium 10-comphorsulfonate
 B-3: diphenyliodonium 10-comphorsulfonate
 B-4: triphenylsulfonium trifluoromethanesulfonate
 B-5: 4-t-butoxyphenyldiphenylsufonium 10-camphorsulfonate
 B-6: N-(camphorsulfonyloxy)-bicyclo-[2.2.1]-heptane-5,6-oxy-2,3-dicarboxyimide Acid diffusion suppressants
 C-1: nicotinic acid amide
 C-2: dicyclohexyl methylamine
 C-3: tri-n-octylamine Additives
 D-1: bisphenol-A
 D-2: 2,2-bis(4-t-butoxyphenyl)propane Solvents
 EL: ethyl lactate
 EEP: ethyl 3-ethoxypropionate
 PGMEA: propylene glycol monomethyl ether acetate The radiation sensitive resin composition of the present invention is capable of resolving any of line-and-space patterns, isolated patterns as well as contact hole patterns with satisfactory appearance and high resolution, which makes it useful for multiple applications. It also has efficient response to ultraviolet rays, far ultraviolet rays, X-rays, or various radioactive rays such as charged particle rays. The radiation sensitive resin composition of the present invention, therefore, can be used exceedingly advantageously as a chemically amplified positive resist for use in the manufacture of semiconductor devices which are expected to further deepen the degree of microfabrication from now on.

Obviously, numerous modifications and variations of the present invention are possible in light of the above teachings. It is therefore to be understood that within the scope of the appended claims, the invention may be practiced otherwise than as specifically described herein.

What is claimed is:

1. A radiation sensitive resin composition, comprising (A) a copolymer containing three types of recurring units having the formulae (1), (2), and (3):

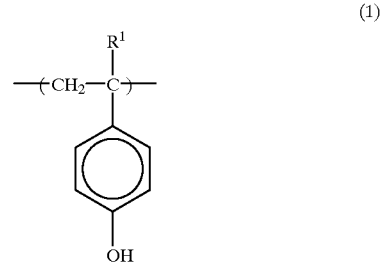

TABLE 1

| | Copolymer (Parts) | Acid generators (Parts) | Acid diffusion suppresants (Parts) | Additives (Parts) | Solvents (Parts) |
|---|---|---|---|---|---|
| Example | | | | | |
| 1 | A-1 (100) | B-2 (2) | C-1 (0.05) | — | EL (350) |
| | | B-4 (3) | C-2 (0.2) | | EEP (200) |
| 2 | A-1 (100) | B-1 (2) | C-3 (0.3) | — | EL (400) |
| | | B-2 (2) | | | EEP (150) |
| 3 | A-1 (100) | B-4 (5) | C-2 (0.3) | — | PGMEA (550) |
| 4 | A-1 (100) | B-2 (2) | C-1 (0.05) | — | EL (550) |
| | | B-3 (3) | C-3 (0.3) | | |
| 5 | A-1 (100) | B-4 (3) | C-1 (0.05) | — | EL (350) |
| | | | C-2 (0.2) | | PGMEA (200) |
| 6 | A-2 (100) | B-5 (3) | C-1 (0.1) | — | EL (350) |
| | | | C-3 (0.2) | | EEP (200) |
| 7 | A-2 (100) | B-6 (8) | C-1 (0.3) | D-1 (10) | PGMEA (550) |
| 8 | A-3 (100) | B-2 (2) | C-1 (0.05) | — | EL (350) |
| | | | | | EEP (200) |
| 9 | A-3 (100) | B-2 (4) | C-3 (0.4) | — | EL (350) |
| | | B-4 (3) | | | PGMEA (200) |
| 10 | A-3 (100) | B-3 (3) | C-2 (0.5) | D-2 (10) | PGMEA (550) |
| Comparative Example | | | | | |
| 1 | a-1 (100) | B-1 (2) | C-3 (0.3) | — | EL (400) |
| | | B-2 (2) | | | EEP (150) |
| 2 | a-1 (100) | B-2 (2) | C-1 (0.05) | — | EL (550) |
| | | B-3 (3) | C-3 (0.3) | | |
| 3 | a-2 (100) | B-2 (2) | C-1 (0.05) | — | EL (550) |
| | | B-3 (3) | C-3 (0.3) | | | wherein $R^1$ is hydrogen or methyl;

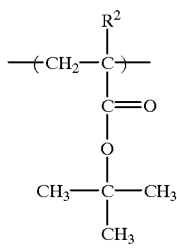
(2)

wherein $R^2$ is hydrogen or methyl;

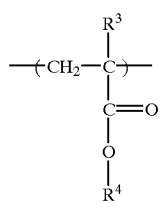
(3)

wherein $R^3$ is hydrogen or methyl, and $R^4$ in the formula (3) is selected from the group consisting of groups having the following formulae (7) and (20):

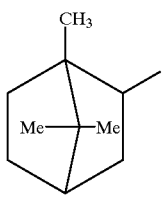
(7)

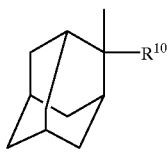
(20)

wherein $R^{10}$ is hydrogen or methyl,
the copolymer turning alkali soluble in the presence of an acid, and (B) a photosensitive acid generator, wherein the recurring units having the formulae (1), (2), and (3) are contained in the copolymer (A) in the amounts of 10 to 75 mol %, 10 to 70 mol %, and 5 to 50 mol %, respectively.

2. The radiation sensitive resin composition according to claim 1, wherein the contents of the recurring units represented by the formulae (1), (2), and (3), in the copolymer (A) are, respectively, 10 to 70 mol %, 10 to 70 mol %, and 5 to 50 mol %.

3. The radiation sensitive resin composition according to claim 1, where $R^{10}$ in the formula (20) is methyl.

4. The radiation sensitive resin composition according to claim 1, wherein the contents of the recurring units represented by the formulae (1), (2), and (3) in the copolymer (A) are, respectively, 67 to 75 mol %, 10 to 70 mol %, and 5 to 50 mol %.

5. The radiation sensitive resin composition according to claim 1, wherein the contents of the recurring units having the formulae (1), (2), and (3) and the copolymer (A) are, respectively, 67 to 75 mol %, 10 to 24 mol % and 5 to 50 mol %.

6. The radiation sensitive resin composition according to claim 1, wherein the copolymer (A) contains a recurring unit other than those represented by the formulas (1), (2), or (3).

7. The radiation sensitive resin composition according to claim 6, wherein said other recurring unit is a unit derived from styrene, p-t-butoxystyrene, p-1-ethoxyethoxystyrene, methyl (meth)acrylate, ethyl (meth)acrylate, or cyclohexyl (meth)acrylate.

8. The radiation sensitive resin composition according to claim 1, wherein the copolymer (A) has a polystyrene-reduced weight average molecular weight (Mw) of 1,000 to 100,000.

9. The radiation sensitive resin composition according to claim 1, wherein the ratio of the polystyrene-reduced weight average molecular weight (Mw) to the polystyrene-reduced number average molecular weight (Mn), Mw/Mn, of the copolymer (A) is 1.0 to 5.0.

10. The radiation sensitive resin composition according to claim 1, wherein the photosensitive acid generator (B) is selected from the group consisting of onium salt compounds, sulfone compounds, sulfonic acid ester compounds, sulfonimide compounds, and diazomethane compounds.

11. The radiation sensitive resin composition according to claim 1 containing the photosensitive acid generator (B) in the proportion of 0.5 to 20 parts by weight for 100 parts by weight of the copolymer (A).

12. The radiation sensitive resin composition according to claim 1 further containing a nitrogen-containing organic compound as an acid diffusion controller to restrain the acid that is generated from the photosensitive acid generator (B) from diffusing inside a resist film.

13. The radiation sensitive resin composition according to claim 12, wherein the content of the acid diffusion controller is 0.001 to 15 parts by weight for 100 parts by weight of the copolymer (A).

14. The radiation sensitive resin composition according to claim 1, wherein the photoacid generator is selected from the group consisting of bis(4-t-butylphenyl)iodonium trifluoromethanesulfonate, bis(4-t-butylphenyl)iodonium nonafluorobutanesulfonate, bis(4-t-butylphenyl)iodonium p-toluenesulfonate, bis(4-t-butylphenyl)iodonium 10-camphorsulfonate, diphenyliodonium trifluoromethanesulfonate, diphenyliodonium nonafluorobutanesulfonate, diphenyliodonium p-toluenesulfonate, diphenyliodonium 10-camphorsulfonate, triphenylsulfonium trifluoromethanesulfonate, triphenylsulfonium nonafluorobutanesulfonate, triphenylsulfonium 10-camphorsulfonate, 4-t-butoxyphenyldiphenylsufonium nonafluorobutanesulfonate, 4-hydroxyphenyl-benzylmethylsulfonium p-toluenesulfonate, N-(trifluoromethylsulfonyloxy)succinimide, N-(trifluoromethylsulfonyloxy)phthalimide, N-(trifluoromethylsulfonyloxy)diphenylmaleimide, N-(trifluoromethylsulfonyloxy)bicyclo-[2.2.1]-hepto-5-ene-2,3-dicarboxyimide, N-(trifluoromethylsulfonyloxy)-7-oxabicyclo-[2.2.1]-hepto-5-ene-2,3-dicarboxyimide, N-(trifluoromethylsulfonyloxy)-bicyclo-[2.2.1]-heptane-5,6-oxy-2,3-dicarboxyimide, N-(trifluoromethylsulfonyloxy) naphthylimide, N-(camphorsulfonyloxy)succinimide, N-(camphorsulfonyloxy)phthalimide, N-(camphorsulfonyloxy)diphenylmaleimide, N-(camphorsulfonyloxy)-bicyclo-[2.2.1]-hepto-5-ene-2,3-dicarboxyimide, N-(camphorsulfonyloxy)-7-oxabicyclo-[2.2.1]-hepto-5-ene-2,3-dicarboxyimide, and N-(camphorsulfonyloxy)-bicyclo-[2.2.1]-heptane-5,6-oxy-2,3-dicarboxyimide, N-(camphorsulfonyloxy)naphthylimide.

15. The radiation sensitive resin composition according to claim 1, wherein the photoacid generator is a compound that generates an acid upon exposure to irradiation and the acid is selected from the group consisting of trifluoromethanesulfonic acid, nonafluorobutanesulfonic acid, and 10-camphorsulfonic acid.

* * * * *